(12) United States Patent
Dudeck et al.

(10) Patent No.: US 7,391,633 B2
(45) Date of Patent: Jun. 24, 2008

(54) ACCELERATED SEARCHING FOR CONTENT-ADDRESSABLE MEMORY

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 184 days.

(21) Appl. No.: 11/460,045

(22) Filed: Jul. 26, 2006

(65) Prior Publication Data

US 2008/0025119 A1    Jan. 31, 2008

(51) Int. Cl.
    *G11C 15/00* (2006.01)
(52) U.S. Cl. .............. 365/49.1; 365/49.11; 365/49.17; 365/185.2; 365/203; 365/207; 711/108
(58) Field of Classification Search .............. 365/49.1, 365/49.11, 49.17, 185.2, 203, 207; 711/108
    See application file for complete search history.

(56) References Cited

U.S. PATENT DOCUMENTS

| | | | | |
|---|---|---|---|---|
| 5,469,378 A | * | 11/1995 | Albon et al. | 365/49.17 |
| 5,859,791 A | * | 1/1999 | Schultz et al. | 365/49.15 |
| 6,137,707 A | * | 10/2000 | Srinivasan et al. | 365/49.15 |
| 6,421,265 B1 | * | 7/2002 | Lien et al. | 365/49.15 |
| 7,251,148 B2 | * | 7/2007 | Ma et al. | 365/49.17 |

* cited by examiner

*Primary Examiner*—Richard T. Elms
*Assistant Examiner*—Eric Wendler
(74) *Attorney, Agent, or Firm*—Ryan, Mason & Lewis, LLP

(57) ABSTRACT

A sensing circuit for use with a CAM circuit including multiple match lines and multiple CAM cells connected to the match lines includes at least one charge sharing circuit and at least one switching circuit connected to the charge sharing circuit. The switching circuit is operative to selectively connect the charge sharing circuit to a corresponding one of the match lines as a function of a first control signal supplied to the switching circuit. The sensing circuit further includes at least one comparator circuit connected to the corresponding match line and operative to generate an output signal indicative of a match between search data supplied to at least a given one of the CAM cells connected to the corresponding match line and data stored in the given CAM cell. The charge sharing circuit is operative to remove an amount of charge on the corresponding match line so as to reduce a voltage on the corresponding match line in conjunction with a search operation of the CAM cell.

21 Claims, 3 Drawing Sheets

ACCELERATED SEARCHING FOR CONTENT-ADDRESSABLE MEMORY

FIELD OF THE INVENTION

The present invention relates generally to memory circuits, and more particularly relates to searching in a content-addressable memory circuit.

BACKGROUND OF THE INVENTION

Content-addressable memory (CAM), also known as associative memory or associative storage, is a type of memory used in, for example, certain very high speed searching applications, such as, lookup tables, databases, data compression, etc. Unlike standard computer memory (e.g., random access memory (RAM)) in which the user supplies a memory address and the RAM returns the data word stored at that address, a CAM is designed such that the user supplies a search word and the CAM searches to see if that search word is stored anywhere in the CAM. If the search word is found, the CAM returns a list of one or more storage addresses where the word was found, and in some architectures, also returns the data word and/or other associated data. Thus, a CAM is the hardware embodiment of what in software terms would be referred to as an associative array.

Because a CAM is designed to search its entire memory in a single operation, it is significantly faster than RAM in virtually all search applications. There are some cost disadvantages to CAM however. For example, unlike RAM, which utilizes comparatively simple storage cells, each individual memory cell in a fully parallel CAM generally has its own associated comparison circuit to detect a match between a stored data bit and an input search bit. Additionally, match line outputs from each CAM cell in a given data word are combined to yield a complete data word match signal. The additional circuitry required by a CAM increases the physical size of the CAM chip which increases manufacturing cost. Moreover, the additional circuitry may increase power dissipation in the chip since in most cases every comparison circuit is active during each clock cycle. Consequently, CAM is typically only used in specialized applications where searching speed cannot be achieved using a less costly approach.

In a standard CAM, each CAM cell contains circuitry for performing an exclusive-OR (XOR) function. The XOR circuits for each data word are then summed by a wired-OR connection onto a match line. During a search operation, if any bit of the supplied search word is different from the corresponding bit of each stored data word, the XOR of the bit that does not match pulls down the match line of the stored word. The time it takes for the match line to discharge when only one bit is different between the search word and the stored word is a significant part of the overall critical delay of the search operation in the CAM. In this scenario, a single XOR circuit must discharge the match line. CAM words can be very wide (e.g., 64, 128 and even 256 bits are commonly used). As the number of CAM cells connected to a given match line in the memory circuit increases, the time for a single CAM cell to discharge the match line increases accordingly. This is due primarily to the increased capacitance on the match line attributable to the CAM cells connected thereto.

In many cases, particularly single-ended sensing applications, the logical state of a selected match line in a CAM is sensed, for example during a search operation, by an inverter connected to the corresponding match line. A local search time of the memory circuit is defined primarily by the time it takes for the voltage on the match line to reach a switching point of the sensing inverter. Therefore, since it is desirable to minimize search time in the CAM, it is beneficial to reduce the time it takes for the voltage on the match line to reach the switching point of the sensing inverter.

One known technique for reducing the search time in a CAM is to employ differential latch sensing. However, latch sensing adds significant complexity to the CAM design due at least in part to the lack of differential match lines and due to the substantial amount of noise generated by simultaneously searching every word stored in the CAM. Another known technique is to employ larger memory cells having increased gain capable of more quickly driving (e.g., charging or discharging) the corresponding match lines. However, using larger memory cells undesirably increases the physical area and the power consumed by the memory cells, and thereby increases the cost of a memory circuit which uses such cells.

Accordingly, there exists a need for an improved searching arrangement and/or CAM cell for use with a CAM circuit which does not suffer from one or more of the problems exhibited by conventional CAM searching methodologies and/or CAM cells.

SUMMARY OF THE INVENTION

The present invention meets the above-noted need by providing, in illustrative embodiments thereof, techniques for advantageously accelerating a searching operation in a CAM circuit. The illustrative embodiments of the present invention advantageously exploit charge sharing principles which enable a match signal associated with one or more CAM cells connected to a given match line to more quickly attain a switching point of corresponding sensing circuitry connected to the match line and thereby reduce a search delay time of the CAM circuit.

In accordance with one aspect of the invention, a sensing circuit for use with a CAM circuit including multiple match lines and multiple CAM cells connected to the match lines includes at least one charge sharing circuit and at least one switching circuit connected to the charge sharing circuit. The switching circuit is operative to selectively connect the charge sharing circuit to a corresponding one of the match lines as a function of a first control signal supplied to the switching circuit. The sensing circuit further includes at least one comparator circuit connected to the corresponding match line and operative to generate an output signal indicative of a match between search data supplied to at least a given one of the CAM cells connected to the corresponding match line and data stored in the given CAM cell. The charge sharing circuit is operative to remove an amount of charge on the corresponding match line so as to reduce a voltage on the corresponding match line in conjunction with a search operation of the CAM cell.

In accordance with another aspect of the invention, a content-addressable memory (CAM) circuit includes a plurality of match lines, a plurality of CAM cells connected to the plurality of match lines, and at least one sensing circuit. The sensing circuit includes at least one charge sharing circuit and at least one switching circuit connected to the charge sharing circuit. The switching circuit is operative to selectively connect the charge sharing circuit to a corresponding one of the match lines as a function of a first control signal supplied to the switching circuit. The sensing circuit further includes at least one comparator circuit connected to the corresponding match line and operative to generate an output signal indicative of a match between search data supplied to at least a given one of the CAM cells connected to the corresponding match line and data stored in the given CAM cell. The charge sharing circuit is operative to remove an amount of charge on the corresponding match line so as to reduce a voltage on the corresponding match line in conjunction with a search operation of the CAM cell.

In accordance with yet another aspect of the invention, accelerated searching methodologies of the present invention may be implemented as embedded memory in an electronic device or alternative system.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a CAM circuit and CAM cells suitable for use therewith. It should be understood, however, that the present invention is not limited to the particular circuit arrangements of the illustrative embodiments shown. Rather, the present invention provides techniques for advantageously improving the performance of a CAM circuit, in at least one aspect, by using charge sharing to reduce the voltage on a charged match line by a prescribed amount so as to allow a data match signal developed on the match line to more quickly reach a switching threshold of corresponding sensing circuitry coupled to the match line. In this manner, a data search time of the CAM circuit is advantageously reduced, without significantly increasing the size of the CAM circuit. The single-ended sensing arrangement formed in accordance with embodiments of the present invention is particularly well-suited for use in a wide variety of CAM applications.

Figure 1:
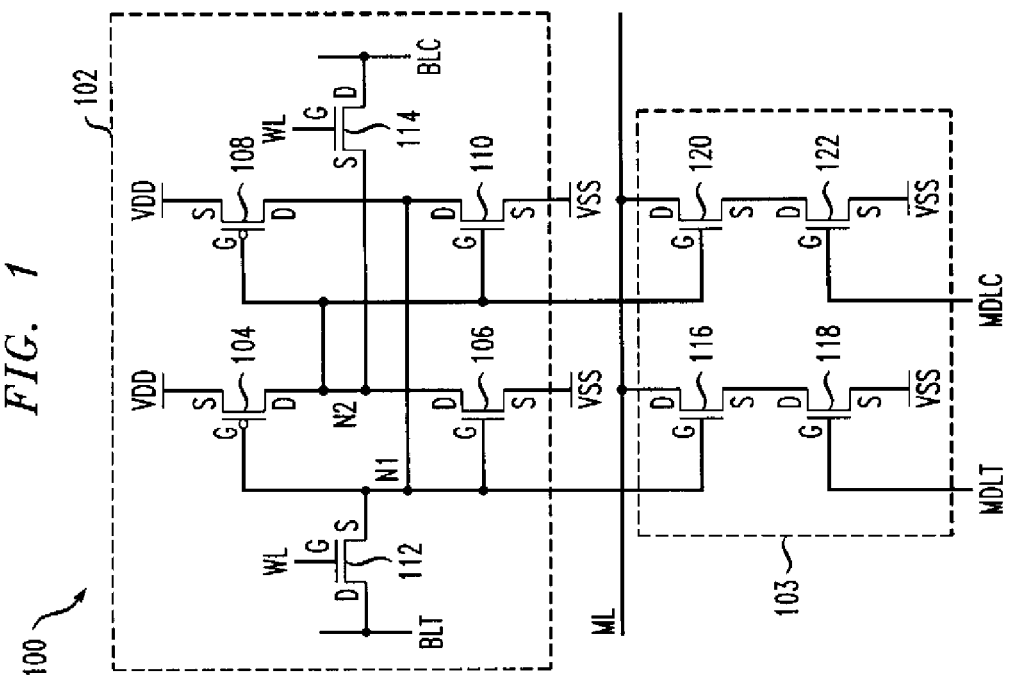

FIG. 1 is a schematic diagram depicting at least a portion of exemplary CAM cell 100 suitable for use with the sensing methodologies of the present invention. CAM cell 100 includes a static random access memory (RAM) storage element 102 comprising a pair of cross-coupled inverters connected by pass transistors to true and complement bit lines, and XOR circuitry 103 coupled to the storage element 102 and to a corresponding match line, ML. Storage element 102 includes a first p-channel field effect transistor (PFET) device 104 having a source (S) connecting to a first voltage source, which may be VDD, a gate (G) connected to a source of a first pass transistor 112 at node N1, and a drain (D) connected to a drain of a first n-channel field effect transistor (NFET) device 106 at node N2. A source of NFET device 106 is configured for connection to a second voltage source, which may be VSS, and a gate of device 106 is connected to the gate of device 104 at node N1. Storage element 102 further includes a second PFET device 108 having a source connecting to VDD, a gate connected to the drains of devices 104 and 106 at node N2, and a drain connected to the gates of devices 104 and 106 at node N1. A drain of a second NFET device 110 is connected to the drain of device 108, a source of device 110 is configured for connection to VSS, and a gate of device 110 is connected to the gate of device 108 at node N2. PFET devices 104, 108 and NFET devices 106, 110 form the pair of cross-coupled inverters. Data stored in the storage element 102 can be read out at nodes N1 and N2, the data at node N2 being a logical complement of the data at node N1. Node N2 may be defined as a true storage node and node N1 may be defined as a complement storage node of the storage element 102.

A first pass transistor 112 connects the cross-coupled inverters to a true bit line, BLT, and a second pass transistor 114 connects the cross-coupled inverters to a complement bit line, BLC. Specifically, a drain of pass transistor 112 is configured for connection to true bit line BLT, a source of transistor 112 is connected to the cross-coupled inverters at node N1, and a gate of transistor 112 is configured for receiving a first control signal, WL, which may be conveyed, for example, by a word line in a CAM circuit in which the CAM cell 100 may be used. Likewise, a drain of pass transistor 114 is configured for connection to complement bit line BLC, a source of transistor 114 is connected to the cross-coupled inverters at node N2, and a gate of transistor 114 is configured for receiving the first control signal WL.

It is to be appreciated that, because a field effect transistor (FET) device is symmetrical in nature, and thus bi-directional, the assignment of source and drain designations in the FET device is essentially arbitrary. Therefore, the source and drain may be referred to herein generally as first and second source/drain, respectively, where "source/drain" in this context denotes a source or a drain.

As previously stated, CAM cells include circuitry for performing an XOR function. The XOR circuits for each data word are then summed, for example, by a wired-OR connection onto a corresponding match line. During a data search operation, if any bit of a supplied search word is different from the corresponding bit of each stored data word, the XOR circuitry in the CAM cell associated with the non-matching bit pulls down the match line of the stored word. The XOR circuitry 103 in CAM cell 100 preferably comprises a pair of stacked NFET devices, although alternative XOR functional circuitry may be similarly employed. Both NFET devices in a given transistor stack must be turned on in order to discharge the match line corresponding to the CAM cell 100. The present invention contemplates the use of other comparison circuitry as well.

XOR circuitry 103 in CAM cell 100 preferably includes a first NFET device 116 having a drain connecting to the match line ML, a gate connected to the storage element 102 at node N1, and a source connected to a drain of a second NFET device 118. A source of device 118 is configured for connection to VSS and a gate of device 118 is configured for receiving true search data, MDLT. XOR circuitry 103 further includes a third NFET device 120 having a drain connecting to match line ML, a gate connected to the storage element 102 at node N2, and a source connected to a drain of a fourth NFET device 122. A source of the fourth device 122 is configured for connection to VSS and a gate of device 122 is configured for receiving complement search data, MDLC, which is a logical complement of true search data MDLT. Transistors 116 and 118 form an upper leg and a lower leg, respectively, of a first transistor stack, and transistors 120 and 122 form an upper leg and a lower leg, respectively, of a second transistor stack.

During normal operation of the CAM cell 100, read and write operations may be performed in a manner consistent with read and write operations in a standard static RAM cell. Such read and write operations are well known by those skilled in the art, and therefore a detailed discussion of read and write operations on the CAM cell will not be presented herein. During a data search operation, true and complement search data MDLT and MDLC, respectively, is presented to the XOR circuitry 103 in the CAM cell 100. If the data stored in the storage element 102 of the CAM cell 100 matches the supplied search data, the match line ML will remain charged to a first voltage level, preferably VDD. Here, it is assumed that the match lines in a given CAM circuit are pre-charged to VDD prior to initiating the search operation, as is typically done. The invention, however, is not limited to any particular voltage for pre-charging the match lines. When the data stored in the CAM cell 100 does not match the supplied search data, the match line ML will begin to discharge to VSS through the two NFET devices in a given transistor stack (e.g., either devices 116 and 118, or devices 120 and 122).

More specifically, since devices 118 and 122 forming the lower legs of the transistor stacks in XOR circuitry 103 receive complementary search data, one of the two devices, 118 or 122, will be turned on and the other device will be turned off at any given time. Likewise, devices 116 and 120 forming upper legs of the transistor stacks receive complementary stored data from nodes N1 and N2, respectively, of storage element 102. Therefore, one of the two devices, 116 or 120, will be turned on and the other device will be turned off at any given time. If the stored data matches the search data, one transistor will be turned on and the other transistor will be turned off in each stack, so that no discharge path exists in either of the two transistor stacks. When the stored data does not match the search data, both devices in one of the transistor stacks will be turned off while both devices in the other transistor stack will be turned on, thereby providing a current path through which the match line will discharge.

By way of example only, assume that storage element 102 stores a logic high data bit (e.g., "1") at node N2. Since node N1 will be a complement of node N2, node N1 will be at a logic low level (e.g., "0"). Node N2 being a logic high level will turn on transistor 120, and node N1 being a logic low level will turn off transistor 116. When true data search bit MDLT is a logic high level, transistor 118 will be turned on. Complement data search bit MDLC will be a logic low level, thereby turning off transistor 122. In this case, where the stored data bit matches the search data bit, match line ML will remain substantially at VDD, its pre-charged level, since essentially no discharge path exists. Conversely, when true data search bit MDLT is a logic low level and complement data search bit MDLC is a logic high level, transistor 122 will be turned on and transistor 118 will be turned off. In this instance, where the stored data bit does not match the search data bit, match line ML will begin to discharge through transistors 120 and 122.

Figure 2:
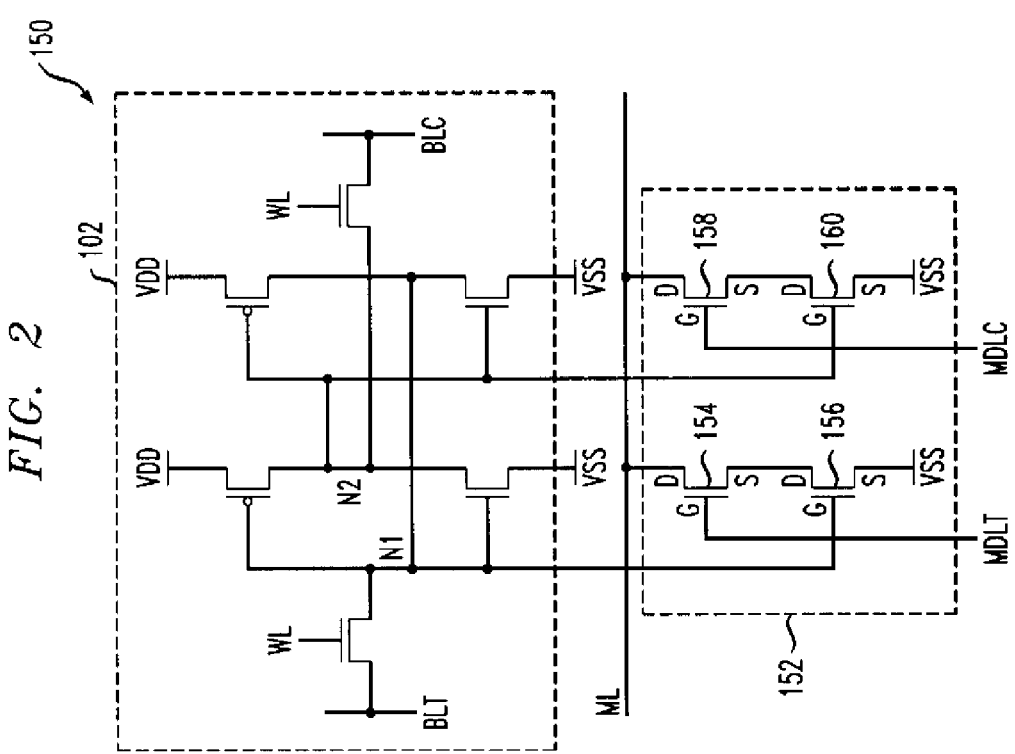
FIGS. 1 and 2 are schematic diagrams depicting at least portions of exemplary CAM cells, in which techniques of the present invention may be implemented.

FIG. 2 is a schematic diagram illustrating at least a portion of another embodiment of a CAM cell 150 suitable for use with the sensing methodologies of the present invention. CAM cell 150, like CAM cell 100 shown in FIG. 1, comprises a static RAM storage element 102, which, although not required, may be essentially the same as the storage element 102 in CAM cell 100. CAM cell 150 further includes XOR circuitry 152 connected to storage element 102. XOR circuitry 152 preferably includes a pair of stacked transistors arranged in a manner similar to the stacked transistor arrangement in XOR circuitry 103 depicted in FIG. 1, except that the gate connections of the transistors in XOR circuitry 152 differs somewhat compared to XOR circuitry 103. Specifically, XOR circuitry 152 comprises a first NFET device 154 having a drain connecting to the match line ML, a gate configured for receiving true search data MDLT, and a source connected to a drain of a second NFET device 156. A source of device 156 is configured for connection to VSS and a gate of device 156 connected to the storage element 102 at node N1. XOR circuitry 152 further includes a third NFET device 158 having a drain connecting to match line ML, a gate configured for receiving complement search data MDLC, and a source connected to a drain of a fourth NFET device 160. A source of device 160 is configured for connection to VSS and a gate of device 160 is connected to the storage element 102 at node N2. Transistors 154 and 156 form an upper leg and a lower leg, respectively, of a first transistor stack, and transistors 158 and 160 form an upper leg and a lower leg, respectively, of a second transistor stack.

XOR circuitry 152 functions in essentially the same manner as the XOR circuitry 103 shown in FIG. 1, namely, when the stored data in storage element 102 matches the search data supplied to the CAM cell 150, match line ML will remain substantially at VDD, its pre-charged level, since no discharge path exists. Conversely, when the stored data does not match the search data, match line ML will begin to discharge through the transistors in one of the transistor stacks (e.g., transistors 154 and 156, or transistors 158 and 160). In contrast to the XOR circuitry 103 described in conjunction with FIG. 1, there is an indeterminate amount of parasitic charge sharing that occurs in XOR circuitry 152. This is primarily a result of the fact that, due to the connection arrangement, the node connecting devices 154 and 156 and the node connecting devices 158 and 160 are floating nodes. Since the voltage at these nodes is uncertain, the amount of parasitic charge sharing that occurs in CAM cell 150 is also uncertain.

Figure 3:
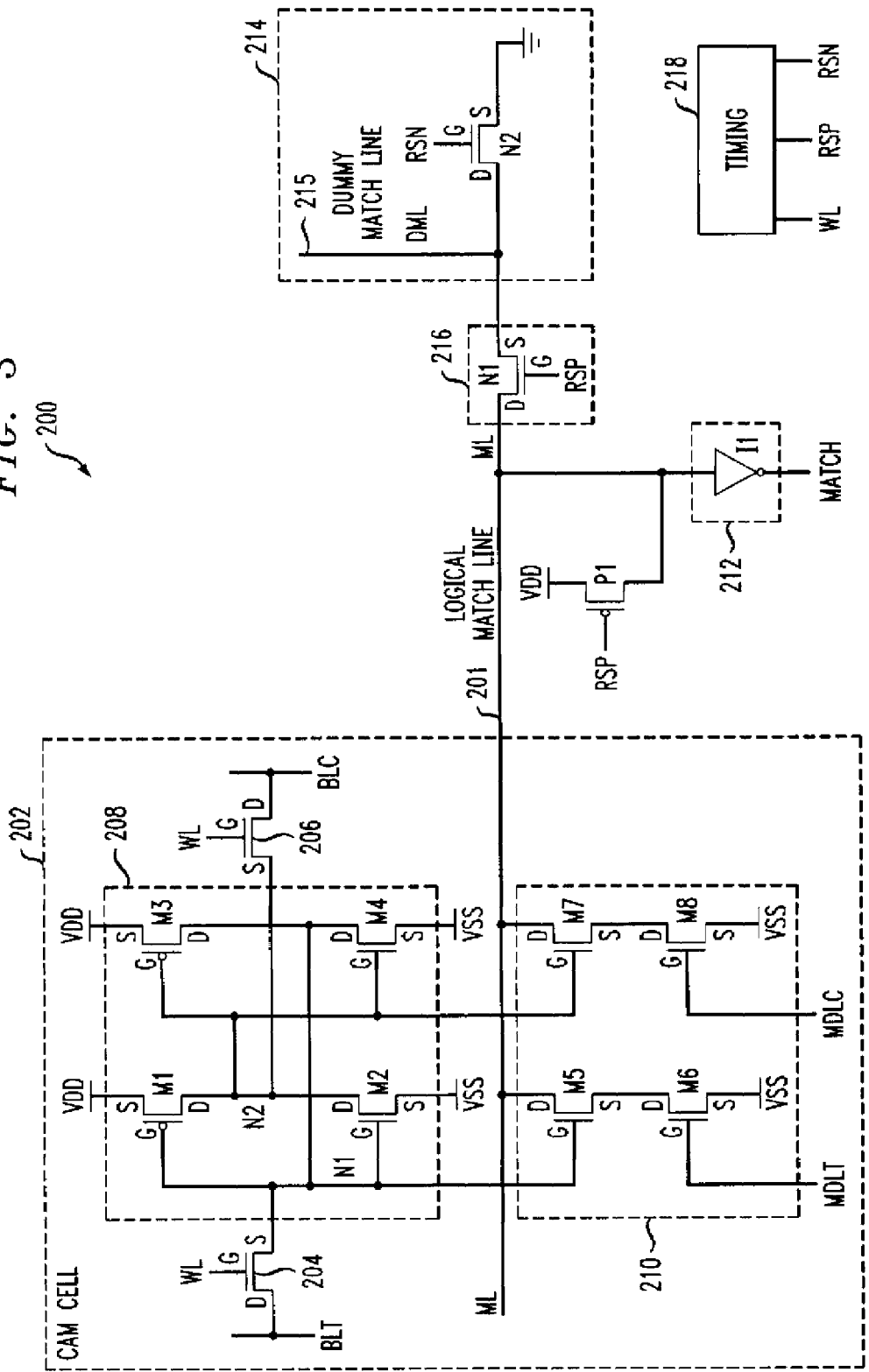
FIG. 3 is a schematic diagram depicting at least a portion of an exemplary CAM circuit in which the searching methodologies of the present invention are used, in accordance with an embodiment of the present invention.

FIG. 3 is a schematic diagram depicting at least a portion of an exemplary CAM circuit 200 in which the searching methodologies of the present invention are used, in accordance with an embodiment of the present invention. CAM circuit 200 may include a plurality of pairs of logical bit lines and a plurality of match lines, of which only a single pair of bit lines, namely, BLT and BLC, and a single match line 201 are shown for ease of explanation. Bit line BLT may be referred to herein as a true bit line and bit line BLC may be referred to as a complement bit line. Each pair of logical bit lines in the CAM circuit preferably comprises a true bit line and a complement bit line. CAM circuit 200 may further include a plurality of CAM cells coupled to corresponding pairs of logical bit lines and match lines, of which a single CAM cell 202 is shown.

CAM cell 202 is preferably formed in a manner consistent with CAM cell 100 shown in FIG. 1, although alternative CAM cell configurations may be similarly employed. Specifically, CAM cell 202 preferably comprises a storage element 208 connected to true and complement bit lines BLT and BLC, respectively, by way of NFET pass transistors 204 and 206. A source of pass transistor 204 is configured for connection to true bit line BLT, a drain of transistor 204 is connected to the storage element 208 at node N1, a source of pass transistor 206 is configured for connection to complement bit line BLC, and a drain of transistor 206 is connected to storage element 208 at node N2. Gates of pass transistors 204 and 206 are configured for receiving control signal WL, which may be a word line signal. Accessing CAM cell 202, such as during a read or a write operation, may be accomplished in a conventional fashion. For example, a write operation in CAM cell 202 may be performed by applying a logic high control signal WL, which may be conveyed in CAM circuit 200 via a corresponding word line (not shown), to NFET pass transistors 204 and 206, and supplying data to be stored in the CAM cell 202 via true and complement bit lines BLT and BLC, respectively.

Storage element 208 includes a PFET device, M1, having a source connecting to a first voltage source, which is preferably VDD, a gate connected to a source of pass transistor 204 at node N1, and a drain connected to a drain of an NFET device, M2. The drains of devices M1 and M2 are connected to a source of pass transistor 206 at node N2. A source of device M2 is configured for connection to a second voltage source, which is preferably VSS, and a gate of M2 is connected to the gate of device M1 at node N1. Storage element 208 further includes a PFET device, M3, having a source connecting to VDD, a gate connected to drains of devices M1 and M2 at node N2, and a drain of M3 connected to a drain of an NFET device, M4. A source of device M4 is configured for connection to VSS and a gate of M4 is connected to a gate of device M3 at node N2. Thus, transistors M1, M2, M3 and M4 are configured as a pair of cross-coupled inverters. Nodes N2 and N1 preferably form true and complement data outputs, respectively, of storage element 208.

CAM cell 202 further includes XOR functional circuitry 210 connected to storage element 208 at nodes N1 and N2, although alternative comparison circuitry may be employed. XOR circuitry 210 is configured for connection to a corresponding logical match line 201. XOR circuitry 210 preferably includes an NFET device, M5, having a drain configured for connection to match line 201, a gate connected to storage element 208 at node N1 and a source connected to a drain of an NFET device, M6. A source of device M6 is configured for connection to VSS, and a gate of M6 is configured for receiving true match data signal, MDLT, as may be conveyed in CAM cell 202 by a corresponding true match data line (not shown). XOR circuitry 210 further includes an NFET device, M7, having a drain configured for connection to match line 201, a gate connected to storage element 208 at node N2, and a source connected to a drain of an NFET device, M8. A source of device M8 is configured for connection to VSS and a gate of M8 is configured for receiving complement match data signal, MDLC, as may be conveyed in CAM cell 202 by a corresponding complement match data line (not shown). As previously explained, XOR circuitry 210 is preferably configured such that when data stored in storage element 208 matches search data supplied to the CAM cell 202 via true and complement match data lines MDLT and MDLC, respectively, match line 201 will remain substantially at its pre-charged level (e.g., logic high level). When the stored data does not match the supplied search data, match line 201 begins to discharge to VSS through the XOR circuitry 210.

Prior to a search operation, match line 201 in the CAM circuit 200 is preferably pre-charged to a prescribed voltage level, such as, for example, VDD, through a corresponding PFET pull-up device P1, or an alternative pre-charging arrangement. Specifically, a source of PFET device P1 is configured for connection to VDD, a drain of P1 is connected to match line 201, and a gate of P1 is configured for receiving a second control signal, RSP. When signal RSP is low (e.g., zero volt), device P1 turns on, thereby charging match line 201 substantially to VDD. A comparator circuit 212 is connected to corresponding match line 201 and is operative to generate an output signal, MATCH, which is indicative of whether or not the supplied search data, MDLT and MDLC, matches the data stored in one or more CAM cells coupled to corresponding match line 201. Since only a subset of the plurality of match lines in a CAM circuit may be utilized at any given time, comparator circuit 212 can be shared by a plurality of match lines and selection circuitry (not shown) may be included in the CAM circuit for connecting the comparator circuit to a selected one of the match lines.

In a single-ended sensing application, comparator circuit 212 preferably comprises, for example, an inverter, I1, having an input coupled to corresponding match line 201 and an output for generating signal MATCH. In this instance, the signal developed on match line 201 is compared against a switching point of the inverter I1, which can be controlled as a function of the respective sizes (e.g., channel width to channel length ratio) of PFET and NFET devices in the inverter. Alternatively, when using a comparator circuit having differential inputs, the signal developed on match line 201 may be compared against a reference signal supplied to the comparator circuit 212. Although more complex in design, this arrangement may be advantageous when additional control, or external control, over the switching threshold of the comparator circuit 212 is desired.

With match line 201 pre-charged to a logic high level (e.g. "1"), signal MATCH will be a logic low level (e.g., "0"). When the search data MDLT, MDLC, applied to CAM cell 202 matches data stored in the CAM cell, no discharge path will be provided by XOR circuitry 210. Therefore, match line 201 will remain high during the search operation so that signal MATCH will be a logic "0." Likewise, when the applied search data does not match the data stored in CAM cell 202, a discharge path to VSS will be provided by XOR circuitry 210. Therefore, during the search operation, match line 201 will discharge to VSS, either through devices M5 and M6, or through devices M7 and M8, depending on the logic state stored in storage element 208 and the logic state of the applied search data MDLT and MDLC. When the voltage on match line 201 has decreased to a level below a switching threshold of comparator 212, which in this embodiment is equal to a switching point of inverter I1, signal MATCH will switch to a logic high state.

As previously stated, in a standard CAM circuit wherein many memory cells are coupled to a given match line, the capacitance attributable to the CAM cells can prevent the match line from being discharged with sufficient speed. A worst case scenario generally occurs when there is only one unmatched data bit in a multiple-bit search word, since only a single CAM cell is available to discharge the corresponding match line. The time it takes for the CAM cell to discharge the match line to below the switching point of inverter I1 constitutes a significant part of the overall search delay through the CAM circuit. In accordance with aspects of the present invention, in order to reduce this delay, charge sharing is advantageously employed to decrease the voltage on a charged match line by a prescribed amount prior to and/or during the search operation. In this manner, the techniques of the invention can be beneficially used to increase the speed with which a valid match signal is generated by the CAM circuit.

In order to implement this charge sharing approach, CAM circuit 200 further comprises a charge sharing circuit 214 including a dummy match line 215 and an NFET device, N2, or other switching circuitry, connected to the dummy match line. Alternative charge sharing circuit arrangements are similarly contemplated by the invention. NFET device N2 is operative to selectively connect the dummy match line 215 to a voltage source, such as ground, so as to enable pre-charging of the dummy match line to a prescribed voltage level prior to a search operation. A source of NFET device N2 is preferably configured for connection to ground or an alternative voltage source, a drain of N2 is connected to the dummy match line 215, and a gate of N2 is configured for receiving a third control signal, RSN. When signal RSN is active (e.g., VDD), device N2 turns on, thereby pre-charging dummy match line 215 to ground. It should be appreciated that although the invention is not limited to any particular voltage levels to which match line 201 and corresponding dummy match line 215 are pre-charged, the voltage level to which dummy match line 215 is pre-charged should be different than the voltage level to which match line 201 is pre-charged, otherwise essentially no charge sharing will occur between the two lines.

Charge sharing circuit 214 is preferably selectively connected to a given logical match line (e.g., 201) via a switching circuit 216, which, in this illustrative embodiment, may comprise an NFET device N1 operative as a pass gate. Alternative switching circuit arrangements are similarly contemplated (e.g., a multiplexer, etc.). A source of device N1 is connected to dummy match line 215, a drain of N1 is configured for connection to logical match line 201, and a gate of N1 is configured for receiving a fourth control signal which, in the illustrative embodiment shown, is the same as the second control signal, namely, RSP. Thus, device N1 is activated when pre-charge device P1 turns off (e.g., signal RSP goes high). Alternatively, two separate control signals may be employed for the pre-charge device P1 and switching circuit 216. While logical match line 201 and dummy match line 215 are being pre-charged, device N1 is disabled (e.g., turned off), thereby electrically isolating the charge sharing circuit 214 from the logical match line 201. After the pre-charge device P1 is turned off, switching device N1 can be turned on to thereby connect charge sharing circuit 214 to logical match line 201. Although each logical match line preferably includes a corresponding charge sharing circuit 214, some applications may only require a subset of the plurality of logical match lines in the CAM circuit to be selected at any given time. In this case, a single charge sharing circuit 214 may be utilized by a plurality of logical match lines, and switching circuit 216 may include a multiplexer, or alternative connection arrangement, operative to selectively connect the charge sharing circuit to an appropriate logical match line.

Control signals WL, RSP and RSN, as well as other signals used by CAM circuit 200, may be generated by a timing circuit 218 included in the CAM circuit. Alternatively, one or more of these control signals may be generated externally relative to the CAM circuit 200 and supplied to the CAM circuit. The generation of timing signals for use with a memory circuit is generally well known by those skilled in the art. Consequently, a detailed discussion of the timing circuit 218 will not be presented herein.

The amount of charge that is removed from logical match line 201 will be a function of a ratio of the capacitance of the logical match line, $C_{ML}$, to the capacitance of the dummy match line 215, $C_{DML}$, but is also limited by NFET device N1 going into cutoff once the dummy match line is charged to about $VDD-Vt-V_{body\ effect}$, where Vt is a threshold voltage of NFET N1 and $V_{body\ effect}$ is a body effect voltage of N1. The ratio of $C_{ML}$ to $C_{DML}$ essentially controls how much the voltage on logical match line 201 is initially reduced by charge sharing. Assuming, for example, that the dummy match line 215 is configured having a capacitance that is substantially equal to the capacitance of corresponding match line 201, then the most the voltage on logical match line 201 will be initially reduced is about fifty percent. To retain at least some margin above the inverter switching point, dummy match line 215 can be configured to be slightly less capacitive than logical match line 201. This can be achieved, for example, by adjusting a length, or alternative dimension, of dummy match line 215 relative to logical match line 201. Since this charge sharing methodology relies on a parasitic capacitance ratio, the resulting effect is substantially insensitive to semiconductor process variations. The charge sharing methodology also scales well with power supply voltage.

In an alternative embodiment, charge sharing circuit 214 may include a capacitor, or other capacitive element, configured having a prescribed capacitance associated therewith. The capacitor may be used in place of, or in addition to, dummy match line 215. For example, a first terminal of the capacitor may be connected to the switching circuit 216 and a second terminal of the capacitor may be configured for connection to ground or an alternative voltage source. Since this arrangement does not rely on a parasitic capacitance ratio, it may be more sensitive to semiconductor process and/or voltage variations, but may provide other benefits, for example in terms of semiconductor area consumed.

It is to be understood that the desired switching point of inverter I1 in comparator circuit 212 will depend, at least in part, on acceptable noise margins for the CAM circuit (e.g., ½ VDD, ⅔ VDD, etc.). The switching point of inverter I1 will, in turn, determine how much charge should be removed from the logical match line 201. The desired amount of charge to be removed from the logical match line 201 should be selected such that the voltage on the logical match line is less than an initial pre-charge voltage (e.g., VDD) on the logical match line and greater than the switching point of inverter I1, after allowing a sufficient margin for variations in semiconductor process, voltage and/or temperature (PVT) conditions to which the CAM circuit may be subjected. If too much charge is removed from the logical match line 201 as a result of the charge sharing circuit, the voltage on the logical match line can drop below the switching threshold of the comparator circuit and thereby cause the CAM circuit to generate an erroneous output signal.

Since the techniques of the illustrative embodiments of the present invention rely on purposely generating a charge sharing event, selection of the particular CAM cell used in the CAM circuit 200 can be crucial. For at least this reason, it is preferable to use CAM cell 100 depicted in FIG. 1 rather than CAM cell 150 depicted in FIG. 2. As previously explained, CAM cell 150 may have an uncertain amount of parasitic charge sharing associated therewith, compared to CAM cell 100. This parasitic charge sharing may further reduce the charge on logical match line 201 to the point that there is insufficient margin for PVT variations to which the CAM circuit 200 may be subjected.

In accordance with another aspect of the invention, the control signal supplied to switching circuit 216 is different than the control signal RSP supplied to PFET device P1 used to pre-charge the match line 201 to VDD. The timing of the control signal used to activate the switching circuit can be configured, relative to the application of search data MDLT and MDLC to initiate the search operation, such that the charge sharing circuit 214 is disconnected from the logical match line 201 during the search operation. Charge sharing circuit 214 is preferably connected to the match line 201 for removing a prescribed amount of charge from the match line, and then the charge sharing circuit can be subsequently disconnected from the match line just before one of the search data signals goes low. In this manner, any capacitance associated with the charge sharing circuit 214 can be removed from the logical match line 201 to allow the CAM cell 202 to more quickly discharge the match line.

Figure 4:
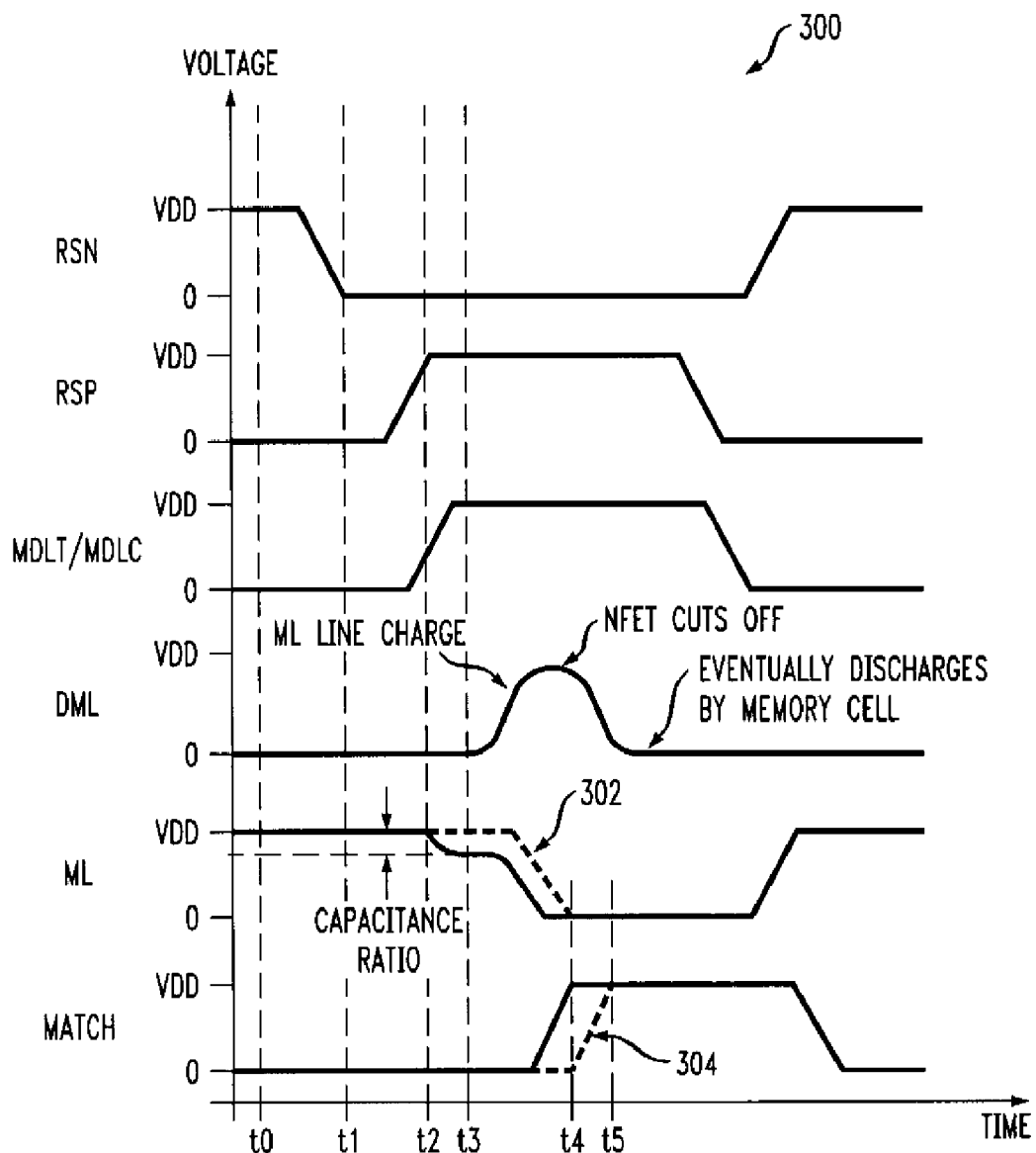
FIG. 4 is a logical timing diagram illustrating exemplary signals corresponding to the CAM circuit shown in FIG. 3, in accordance with an embodiment of the present invention.

FIG. 4 is a logical timing diagram 300 illustrating exemplary signals corresponding to the CAM circuit 200 shown in FIG. 3, in accordance with an embodiment of the invention. As apparent from the figure, at time t0, control signal RSP is low (e.g., 0) and RSN is high (e.g., VDD). Signal RSP being low turns on PFET device P1, thereby pre-charging logical match line 201 high, as indicated by logical match line signal ML. Signal RSP being low also turns off NFET device N1, thereby isolating logical match line 201 from the charge sharing circuit 214. Signal RSN being high turns on NFET device N2, thereby pre-charging dummy match line 215 low, as indicated by dummy match line signal DML.

At time t1, signal RSN is low, thereby turning off NFET device N2 and allowing dummy match line 215 to essentially float. At time t2, signal RSP is high, thereby turning off PFET device P1 and ending the pre-charging of logical match line 201. Signal RSP being high also turns on NFET device N1, thereby connecting the charge sharing circuit 214 to logical match line 201. Once the charge sharing circuit is connected to logical match line 201, some of the charge on the logical match line will begin to be transferred to dummy match line 215 in accordance with principles of conservation of charge. As previously explained, the amount of charge removed from the logical match line will be a function of a ratio of the capacitance of the logical match line to the capacitance of the charge sharing circuit (e.g., primarily the capacitance of the dummy match line). Assuming the capacitances of the logical and dummy match lines are substantially equal to one another, the amount of charge removed from the logical match line and added to the dummy match line will be about half of the initial charge on the logical match line.

During initiation of a search cycle at time t3, one of the differential search data signals, MDLT or MDLC, for a given column goes high, thereby turning on one of the transistors, M6 or M8, respectively, in XOR circuitry 210 in CAM cell 202. If the stored data in CAM cell 202 matches the applied search data, match line 201 remains at its pre-charged voltage level (ignoring any leakage current on the match line). Conversely, in the present illustration it is assumed that the data stored in the CAM cell does not match the applied search data. In this instance, either one of the stacked transistors in the XOR circuitry 210 will conduct, and therefore the CAM cell begins discharging the logical match line to ground. However, since some charge has already been removed from the logical match line as a result of the charge sharing circuit, the amount of time required to discharge the match line to below the switching threshold of the comparator circuit 212 is significantly reduced compared to a standard CAM circuit. Without the charge sharing circuit, the logical match line voltage ML will not begin to decrease until after the search cycle has been initiated (e.g., after time t3), as indicated by trace 302. Once the voltage ML on the logical match line drops below the switching threshold of the comparator circuit 212, the output signal MATCH generated by the comparator circuit goes high at time t4. Time t5 indicates the point at which the output signal MATCH goes high following trace 304, which represents the CAM circuit performance without the charge sharing circuit. The difference between times t5 and t4, namely, t5−t4, represents the reduction in delay time of the CAM circuit attributable to the charge sharing circuit.

As stated above, if too much charge is removed from the logical match line as a result of the charge sharing circuit, the voltage on the logical match line can drop below the switching threshold of the comparator circuit and thereby cause the CAM circuit to generate an erroneous output signal. As apparent from the figure, the amount of charge transferred to the dummy match line from the logical match line will effectively be limited by the cutoff of NFET device N1 in switching circuit 216. Specifically, since the gate voltage of device N1 is VDD, as the voltage DML on the dummy match line rises to about a threshold voltage plus a body effect voltage of device N1 below VDD, device N1 will begin to cut off. This cutoff effect of the NFET device provides a self-limiting mechanism to beneficially prevent too much charge from being bleed off the logical match line.

The sensing methodologies of embodiments of the invention may be particularly well-suited for use in a memory embedded in an electronic device or alternative system. For example, an illustrative electronic device formed in accordance with another aspect of the invention may include a microprocessor, or alternative processing device (e.g., digital signal processor, microcontroller, central processor unit, etc.), memory coupled to the microprocessor (e.g., via a bus or alternative connection means), as well as input/output circuitry operative to interface with the microprocessor (e.g., for presenting data to the microprocessor and/or for obtaining data from the microprocessor). In various embodiments, the single-ended sensing circuit of the present invention can be included within many storage application areas within the electronic device.

At least a portion of the apparatus and methodologies of the present invention may be implemented in one or more integrated circuits. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A sensing circuit for use with a content-addressable memory (CAM) circuit including a plurality of match lines and a plurality of CAM cells connected to the match lines, the sensing circuit comprising:

at least one charge sharing circuit;

at least one switching circuit connected to the at least one charge sharing circuit and being operative to selectively connect the charge sharing circuit to a corresponding one of the match lines as a function of a first control signal supplied to the at least one switching circuit; and at least one comparator circuit connected to the corresponding match line, the comparator circuit being operative to generate an output signal indicative of a match between search data supplied to at least a given CAM cell connected to the corresponding match line and data stored in the given CAM cell;

wherein the charge sharing circuit is operative to remove an amount of charge on the corresponding match line so as to reduce a voltage on the corresponding match line in conjunction with a search operation of the CAM cell.

2. The sensing circuit of claim 1, wherein the at least one charge sharing circuit comprises:

at least one dummy match line; and a second switching circuit connected to the at least one dummy match line and being operative to selectively connect the at least one dummy match line to a first voltage source as a function of a second control signal.

3. The sensing circuit of claim 1, wherein the at least one charge sharing circuit comprises:

a capacitor; and a second switching circuit connected to the capacitor and being operative to selectively connect the capacitor to a first voltage source as a function of a second control signal.

4. The sensing circuit of claim 1, wherein the comparator circuit comprises an inverter including an input for connection to the corresponding match line and an output for generating the output signal.

5. The sensing circuit of claim 1, wherein the charging sharing circuit is configured to reduce the voltage on the match line to less than an initial pre-charge voltage level on the match line and greater than a switching threshold of the at least one comparator circuit.

6. The sensing circuit of claim 1, wherein the switching circuit comprises a field-effect transistor device including a first source/drain connected to the charge sharing circuit, a second source/drain configured for connection to the corresponding match line, and a gate configured for receiving the first control signal.

7. The sensing circuit of claim 1, further comprising a pre-charge circuit configured for connection to the corresponding match line and being operative to selectively charge the corresponding match line to a first voltage level prior to initiation of the search operation in the CAM cell.

8. The sensing circuit of claim 1, further comprising a timing circuit operative to generate at least the first control signal.

9. The sensing circuit of claim 1, wherein the corresponding match line is initially charged to a first voltage level.

10. The sensing circuit of claim 2, wherein the at least one dummy match line is configured such that a capacitance of the at least one dummy match line is substantially equal to a capacitance of the corresponding match line.

11. The sensing circuit of claim 3, wherein a capacitance of the capacitor is substantially equal to a capacitance of the corresponding match line.

12. The sensing circuit of claim 7, wherein the pre-charge circuit comprises a field-effect transistor device including a first source/drain configured for connection to a first voltage source having the first voltage level, a second source/drain configured for connection to the corresponding match line, and a gate configured for receiving a second control signal.

13. A content-addressable memory (CAM) circuit, comprising:
    a plurality of match lines;
    a plurality of CAM cells connected to the plurality of match lines; and
    at least one sensing circuit, the at least one sensing circuit comprising:
        at least one charge sharing circuit;
        at least one switching circuit connected to the at least one charge sharing circuit and being operative to selectively connect the charge sharing circuit to at least a given one of the match lines as a function of a first control signal supplied to the at least one switching circuit; and
        at least one comparator circuit connected to the given match line, the comparator circuit being operative to generate an output signal indicative of a match between search data supplied to at least a given CAM cell connected to the given match line and data stored in the given CAM cell;
    wherein the charge sharing circuit is operative to remove an amount of charge on the given match line so as to reduce a voltage on the given match line in conjunction with a search operation of the CAM cell.

14. The CAM circuit of claim 13, wherein the at least one charge sharing circuit comprises:
    at least one dummy match line; and
    a second switching circuit connected to the at least one dummy match line and being operative to selectively connect the at least one dummy match line to a first voltage source as a function of a second control signal.

15. The CAM circuit of claim 13, wherein the at least one charge sharing circuit comprises:
    a capacitor; and
    a second switching circuit connected to the capacitor and being operative to selectively connect the capacitor to a first voltage source as a function of a second control signal.

16. The CAM circuit of claim 13, wherein the charging sharing circuit is configured to reduce the voltage on the match line to less than an initial pre-charge voltage level on the match line and greater than a switching threshold of the at least one comparator circuit.

17. The CAM circuit of claim 13, further comprising a pre-charge circuit configured for connection to the given match line and being operative to selectively charge the given match line to a first voltage level prior to initiation of the search operation in the CAM cell.

18. The CAM circuit of claim 14, wherein the at least one dummy match line is configured such that a capacitance of the at least one dummy match line is substantially equal to a capacitance of the given match line.

19. An integrated circuit including at least one sensing circuit for use with a content-addressable memory (CAM) circuit including a plurality of match lines and a plurality of CAM cells connected to the match lines, the at least one sensing circuit comprising:
    charge sharing circuitry;
    switching circuitry connected to the charge sharing circuitry and being operative to selectively connect the charge sharing circuitry to a corresponding one of the match lines as a function of a first control signal supplied to the switching circuitry; and
    at least one comparator connected to the corresponding match line, the comparator being operative to generate an output signal indicative of a match between search data supplied to at least one CAM cell connected to the corresponding match line and data stored in the at least one CAM cell;
    wherein the charge sharing circuitry is operative to remove an amount of charge on the corresponding match line so as to reduce a voltage on the corresponding match line in conjunction with a search operation of the CAM cell.

20. An integrated circuit including at least one content-addressable memory (CAM) circuit, the at least one CAM circuit comprising:
    a plurality of match lines;
    a plurality of CAM cells connected to the plurality of match lines; and
    at least one sensing circuit, the at least one sensing circuit comprising:
        charge sharing circuitry;
        switching circuitry connected to the charge sharing circuitry and being operative to selectively connect the charge sharing circuitry to at least a given one of the match lines as a function of a first control signal supplied to the switching circuitry; and
        at least one comparator connected to the given match line, the comparator being operative to generate an output signal indicative of a match between search data supplied to at least one CAM cell connected to the given match line and data stored in the at least one CAM cell;

wherein the charge sharing circuitry is operative to remove an amount of charge on the given match line so as to reduce a voltage on the given match line in conjunction with a search operation of the CAM cell.

21. A system including an embedded memory, the embedded memory comprising:

a plurality of match lines;

a plurality of content-addressable memory (CAM) cells connected to the plurality of match lines; and at least one sensing circuit, the at least one sensing circuit comprising:

at least one charge sharing circuit;

at least one switching circuit connected to the at least one charge sharing circuit and being operative to selectively connect the charge sharing circuit to at least a given one of the match lines as a function of a first control signal supplied to the at least one switching circuit; and at least one comparator circuit connected to the given match line, the comparator circuit being operative to generate an output signal indicative of a match between search data supplied to at least a given CAM cell connected to the given match line and data stored in the given CAM cell;

wherein the charge sharing circuit is operative to remove an amount of charge on the given match line so as to reduce a voltage on the given match line in conjunction with a search operation of the CAM cell.

* * * * *